(12) United States Patent
Lee et al.

(10) Patent No.: US 7,016,220 B2
(45) Date of Patent: Mar. 21, 2006

(54) MAGNETO-RESISTIVE RANDOM ACCESS MEMORY

(75) Inventors: Geun Il Lee, Kyoungki-do (KR); Hee Bok Kang, Daejeon (KR); Jung Hwan Kim, Seoul (KR)

(73) Assignee: Hynix Semiconductor Inc., Kyoungki-do (KR)

(*) Notice: Subject to any disclaimer, the term of this patent is extended or adjusted under 35 U.S.C. 154(b) by 114 days.

(21) Appl. No.: 10/331,815

(22) Filed: Dec. 30, 2002

(65) Prior Publication Data
US 2003/0179602 A1    Sep. 25, 2003

(30) Foreign Application Priority Data
Mar. 22, 2002 (KR) .................. 10-2002-0015560

(51) Int. Cl.
G11C 11/14 (2006.01)
G11C 11/15 (2006.01)
G11C 7/14 (2006.01)

(52) U.S. Cl. ............... 365/158; 365/171; 365/173; 365/210

(58) Field of Classification Search ............ 365/158, 365/171, 173, 207, 210, 209
See application file for complete search history.

(56) References Cited

U.S. PATENT DOCUMENTS

| | | | |
|---|---|---|---|
| 5,402,064 A * | 3/1995 | Eck et al. ............. | 324/207.21 |
| 6,055,178 A | 4/2000 | Naji | |
| 6,205,072 B1 * | 3/2001 | Jung .................... | 365/207 |
| 6,208,176 B1 * | 3/2001 | Schroeder et al. ..... | 327/108 |
| 6,317,376 B1 * | 11/2001 | Tran et al. ............. | 365/210 |
| 6,324,093 B1 * | 11/2001 | Perner et al. .......... | 365/171 |
| 6,385,109 B1 * | 5/2002 | Naji ..................... | 365/209 |
| 6,608,776 B1 * | 8/2003 | Hidaka ................. | 365/171 |
| 6,678,187 B1 * | 1/2004 | Sugibayashi et al. .. | 365/171 |

FOREIGN PATENT DOCUMENTS

JP    2000-315383    11/2000

OTHER PUBLICATIONS

Korean Intellectual Property Office, Notice of Rejection for Application No. 2002-0015560 dated Mar. 29, 2004.

* cited by examiner

Primary Examiner—Richard Elms
Assistant Examiner—J. H. Hur
(74) Attorney, Agent, or Firm—Marshall, Gerstein & Borun LLP

(57) ABSTRACT

A magneto-resistive random access memory (MRAM) stably read data stored in an MRAM cell in a magnetization direction of a variable magnetic layer of an MTJ element. The MRAM includes a first current sinking circuit to convert a current flowing to a sense amplifier node through a current path comprised of a plurality of bit lines into a voltage in an MRAM cell during the data read operation. A second current sinking circuit is also included to convert a current flowing to a reference node into a voltage in a reference MRAM cell. A sense amplifier is included to compare the signal from the first current sinking circuit with the reference signal from the second current sinking circuit, and perform an amplifying operation thereon to read data stored in the MRAM cell.

12 Claims, 12 Drawing Sheets

MAGNETO-RESISTIVE RANDOM ACCESS MEMORY

TECHNICAL FIELD

The present patent relates to a magneto-resistive random access memory (MRAM), and in particular to an improved MRAM which can prevent a mis-operation due to different operational properties of cells.

BACKGROUND

As demand for portable apparatuses and communication apparatuses have increased sharply, there has been a strong necessity for a non-volatile memory which can overcome reading/writing limits of a volatile memory. For this, there has been suggested an MRAM using the fact that magnetic resistances are different according to relative arrangement of magnetic poles.

The MRAM is a memory for storing magnetic polarization in a magnetic material thin film. That is, the MRAM embodies a memory device by using a giant magneto resistive (GMR) or spin-polarized magneto-transmission (SPMT) phenomenon. In general, the MRAM uses a memory device using a magnetic phenomenon such as GMR and MTJ as a memory cell for storing data.

The MRAM using the GMR phenomenon takes advantage of the principle that resistance is larger when spin directions are different in two magnetic layers having a non-magnetic layer therebetween, than when spin directions are identical. The MRAM using the SPMT phenomenon takes advantage of the principle that larger current transmission is generated when spin directions are identical in two magnetic layers having an insulating layer therebetween than when spin directions are different.

FIG. 1 is a view illustrating a cell array and a sense amplifier of a conventional MRAM. Referring to FIG. 1, an MRAM cell includes word lines WL1–WLn, bit lines BL1–BLm, a sense amplifier SA and a data output buffer 2. A cell 1 is composed of a switching transistor T and a magneto-resistive tunneling junction (MTJ) element.

When a word line is selected, a current flows through the bit line. The amount of current is determined according to a magnetization direction of a variable magnetic layer of the MTJ element. The sense amplifier SA compares the current of the bit line with a reference signal REF to perform a sensing operation, and the data output buffer 2 transmits the data from the sense amplifier SA.

However, since the MTJ element is connected to the bit line, sensing sensitivity is reduced due to variations of a contact resistance in the stacked structure, thereby generating a mis-operation of the MRAM.

SUMMARY OF THE DISCLOSURE

A current sinking circuit utilizing an MRAM is disclosed herein. The current sinking circuit provides the ability to stably read data stored in the MRAM cell according to a magnetization direction of a variable magnetic layer of an MTJ element.

The MRAM includes a first current sinking circuit to convert a current flowing from an MRAM cell to a sense amplifier node into a voltage during a data read operation. The MRAM also includes a second current sinking circuit to convert a reference current flowing from a reference MRAM cell to a reference node into a reference voltage; and a sense amplifier for amplifying and comparing the voltage from the first current sinking circuit with the reference voltage from the second current sinking circuit.

BRIEF DESCRIPTION OF THE DRAWINGS

The disclosure will be described in terms of several embodiments to illustrate its broad teachings. Reference is also made to the attached drawings.

DETAILED DESCRIPTION OF THE PREFERRED EMBODIMENTS

The present disclosure will be described in detail with reference to the accompanying drawings.

Figure 1:
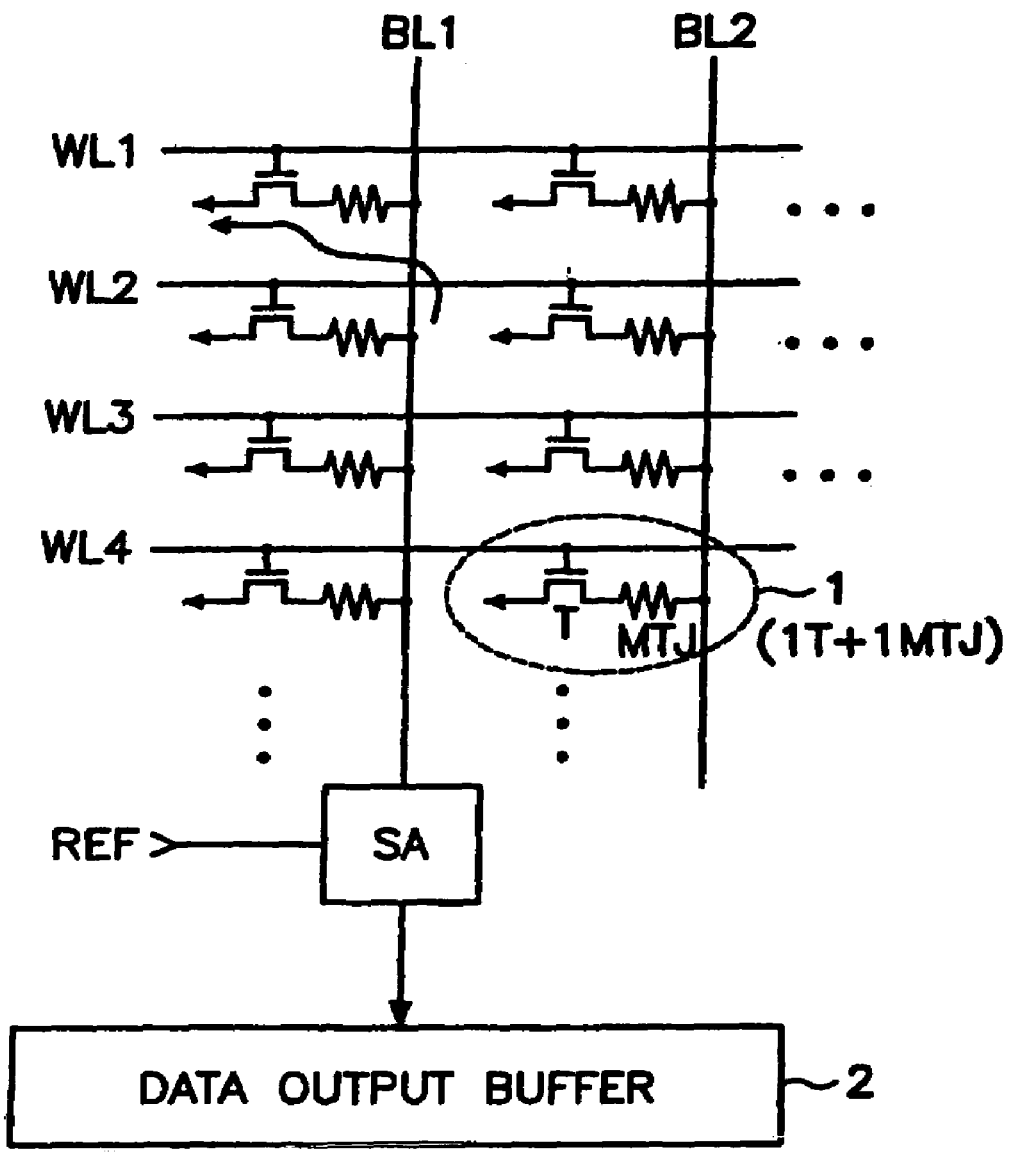
FIG. 1 is a view illustrating a cell array and a sense amplifier of a conventional MRAM.
Figure 2:
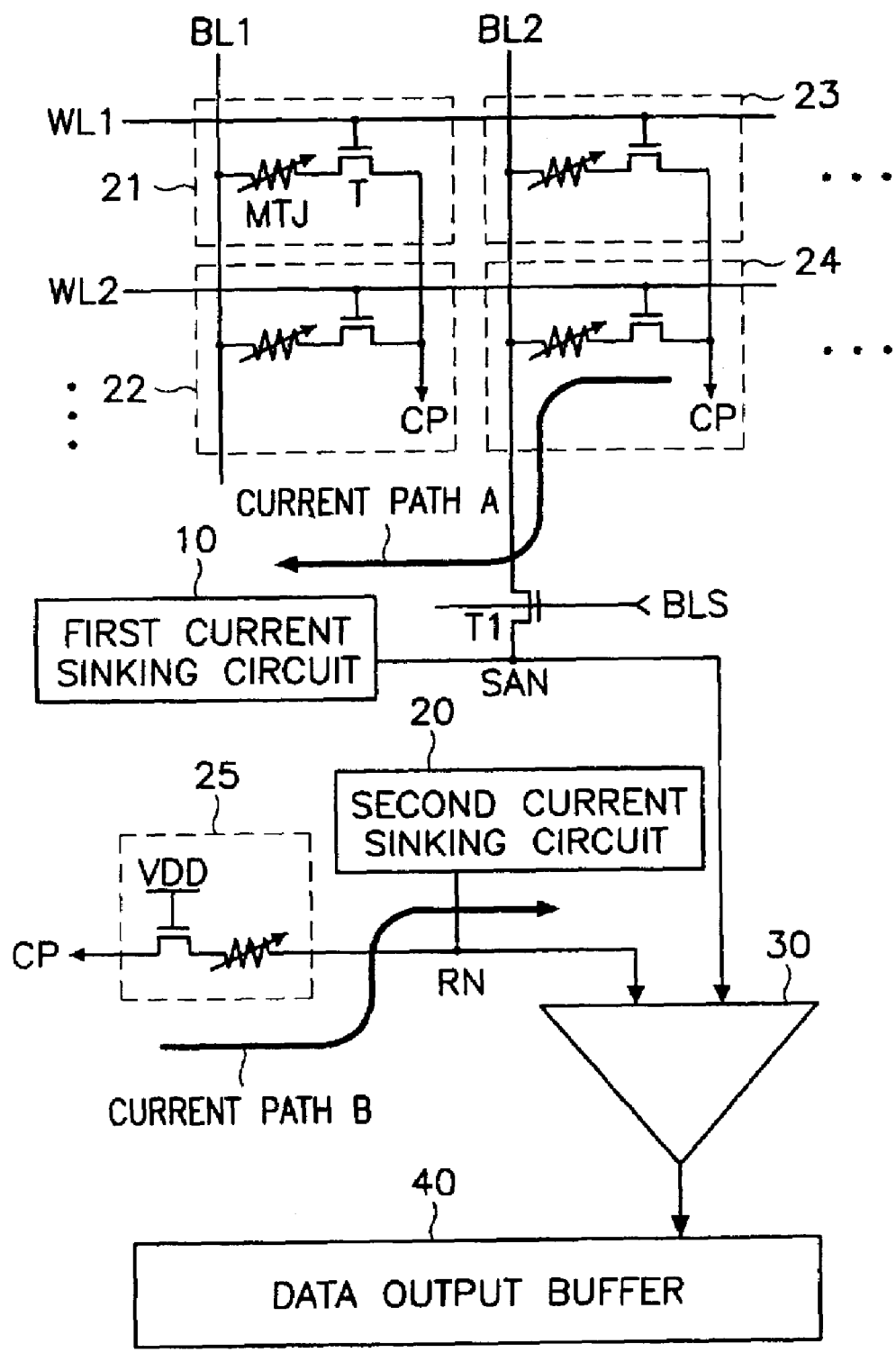
FIG. 2 is a view illustrating a first embodiment of an MRAM cell array.

FIG. 2 is a view illustrating a first embodiment of an MRAM cell array. The MRAM cell array includes a plurality of MRAM cells 21–24 connected to bit lines BL (including BL1–BLm) and word lines WL (WL1–WLn), a first current sinking circuit 10, a reference MRAM cell 25 to receive a power supply voltage VDD, a second current sinking circuit 20 connected to the reference MRAM cell 25. A sense amplifier 30 to amplify and compare the voltages output from the current sinking circuits 10 and 20, and sense a high/low level data, and a data output buffer 40 to transmit the data from the sense amplifier 30. The bit lines BL are connected to the first current sinking circuit 10 and the sense amplifier 30 through a transistor T1 controlled according to a bit line select signal BLS.

Here, each of the MRAM cells 21–24 and the reference MRAM cell 25 include one MTJ element and one transistor. In each of the MRAM cells 21–24, the MTJ element is connected to the bit line BL, and the transistor T has its gate connected to the word line W and its drain and source connected respectively to the MTJ element and a cell plate CP. In the reference MRAM cell 25, the MTJ element is connected to a reference node RN, and the transistor T has its gate connected to the power supply voltage VDD and its drain and source connected respectively to the MTJ element and a cell plate CP.

In the data read operation of the MRAM cell, the word line WL and the bit line are selected, and a voltage is applied to the cell plate CP of the selected MRAM cell. Therefore, a current path A is formed from the MTJ element of the MRAM cell to the first current sinking circuit 10. The amount of current flowing through the current path A is determined according to a magnetization direction of a variable magnetic layer of the MTJ element. The data stored in the MRAM cell can be read by sensing a current flowing through the current path A.

Figure 6:
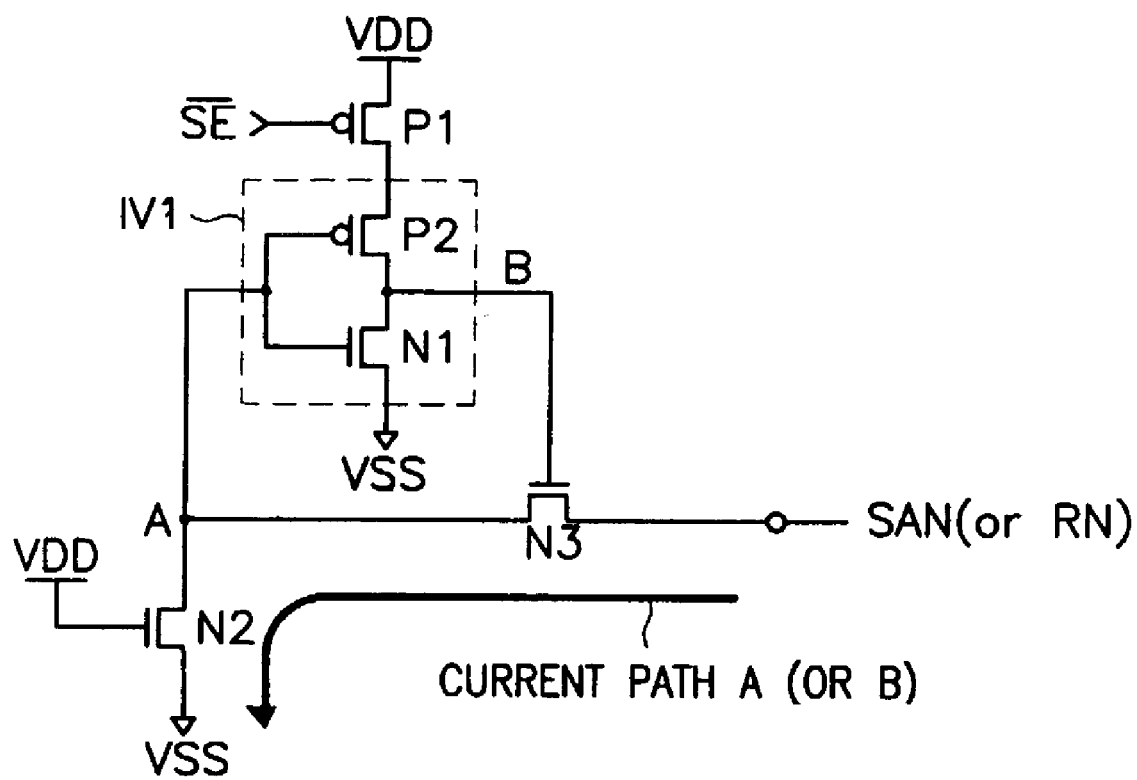
FIG. 6 is a circuit view illustrating a current sinking circuit of FIGS. 2 to 5.

The first current sinking circuit 10 which will later be explained with reference to FIG. 6 is enabled in response to an inverted sense amplifier enable signal $\overline{SE}$ during the data read operation of the MRAM cell, and converts the current flowing through the current path A into a voltage. The first current sinking circuit 10 amplifies the converted voltage and outputs it to a sense amplifier node SAN.

In the reference MRAM cell 25, a difference of magnetization direction between a variable magnetic layer and a pinned magnetic layer of the MTJ element is ½π. In the data read operation, a voltage is applied to the cell plate CP of the reference MRAM cell 25, thereby forming a current path B from the MTJ element of the reference MRAM cell 25 to the second current sinking circuit 20.

Identically to the first current sinking circuit 10, the second current sinking circuit 20 is enabled in response to the inverted sense amplifier enable signal $\overline{SE}$ during the data read operation of the MRAM cell. The second current sinking circuit 20 converts the current flowing through the current path B into a voltage, amplifies the voltage, and outputs it to the reference node RN. The voltage on the reference node RN has an intermediate value between voltages generated from the high and low level data of the MTJ element.

Figure 7:
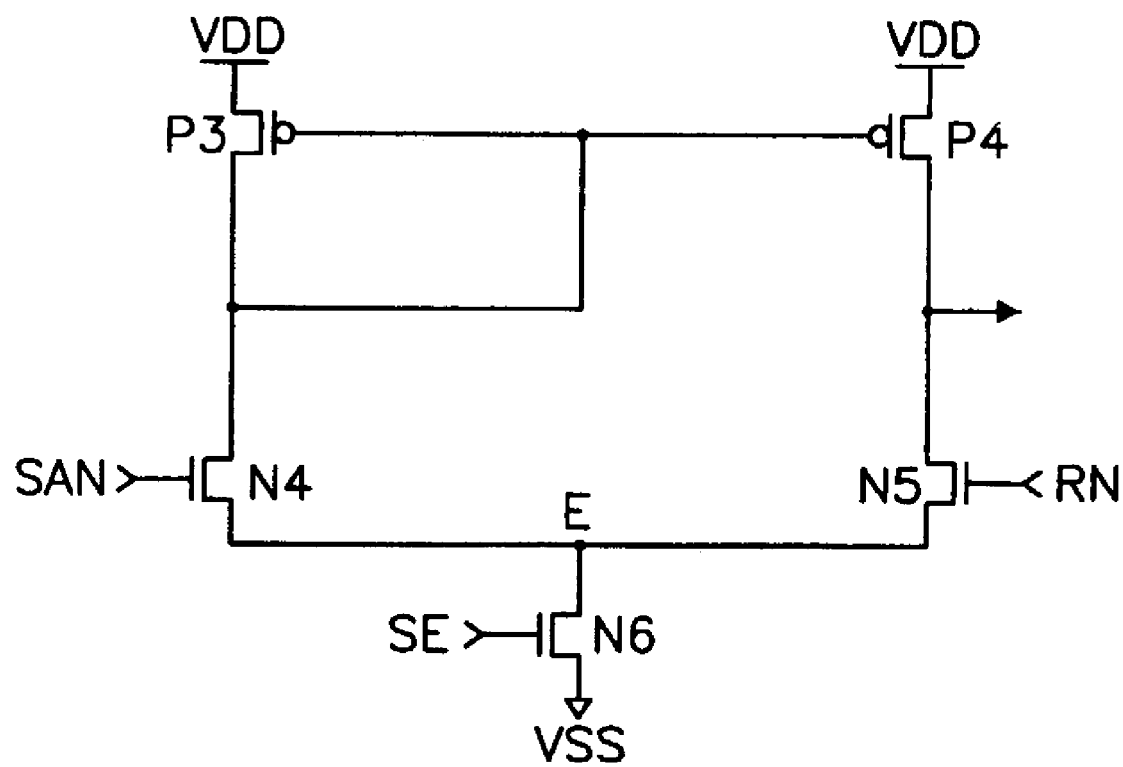
FIG. 7 is a circuit view illustrating a sense amplifier of FIGS. 2 to 5.

The sense amplifier 30 which will later be explained with reference to FIG. 7 is enabled in response to a sense amplifier enable signal SE, and compares the voltage of the sense amplifier node SAN with the reference voltage of the reference node RN. The sense amplifier 30 amplifies the operation result, discriminates the high/low level data, and outputs it to the data output buffer 40.

Figure 3:
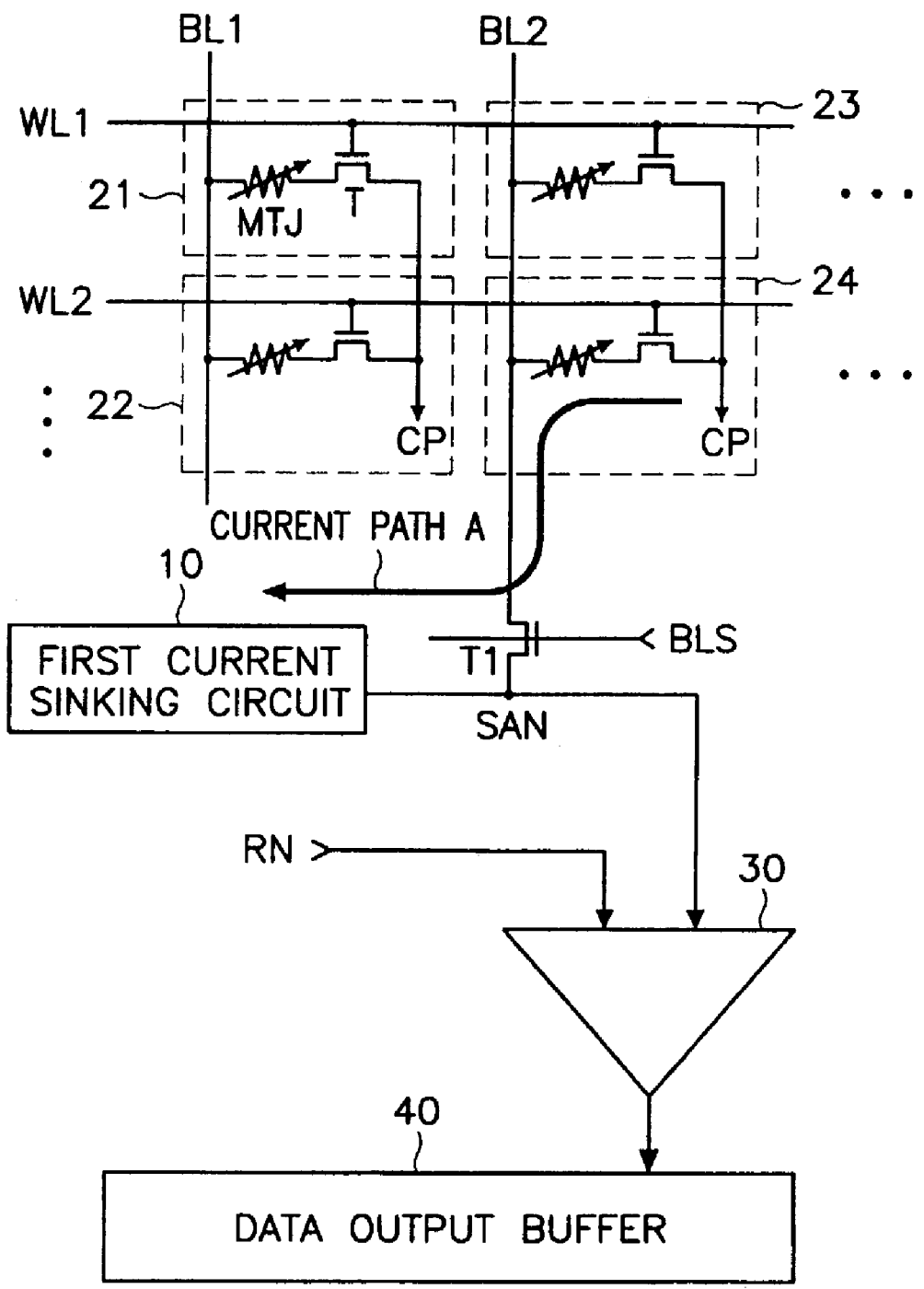
FIG. 3 is a view illustrating a second embodiment of an MRAM cell array.

The first embodiment of FIG. 2 can be modified into a second embodiment of FIG. 3. The MRAM cell array of the second embodiment does not include a reference MRAM cell and a second current sinking circuit, but supplies a reference voltage of a predetermined level as a reference node RN to a sense amplifier 30.

Figure 4:
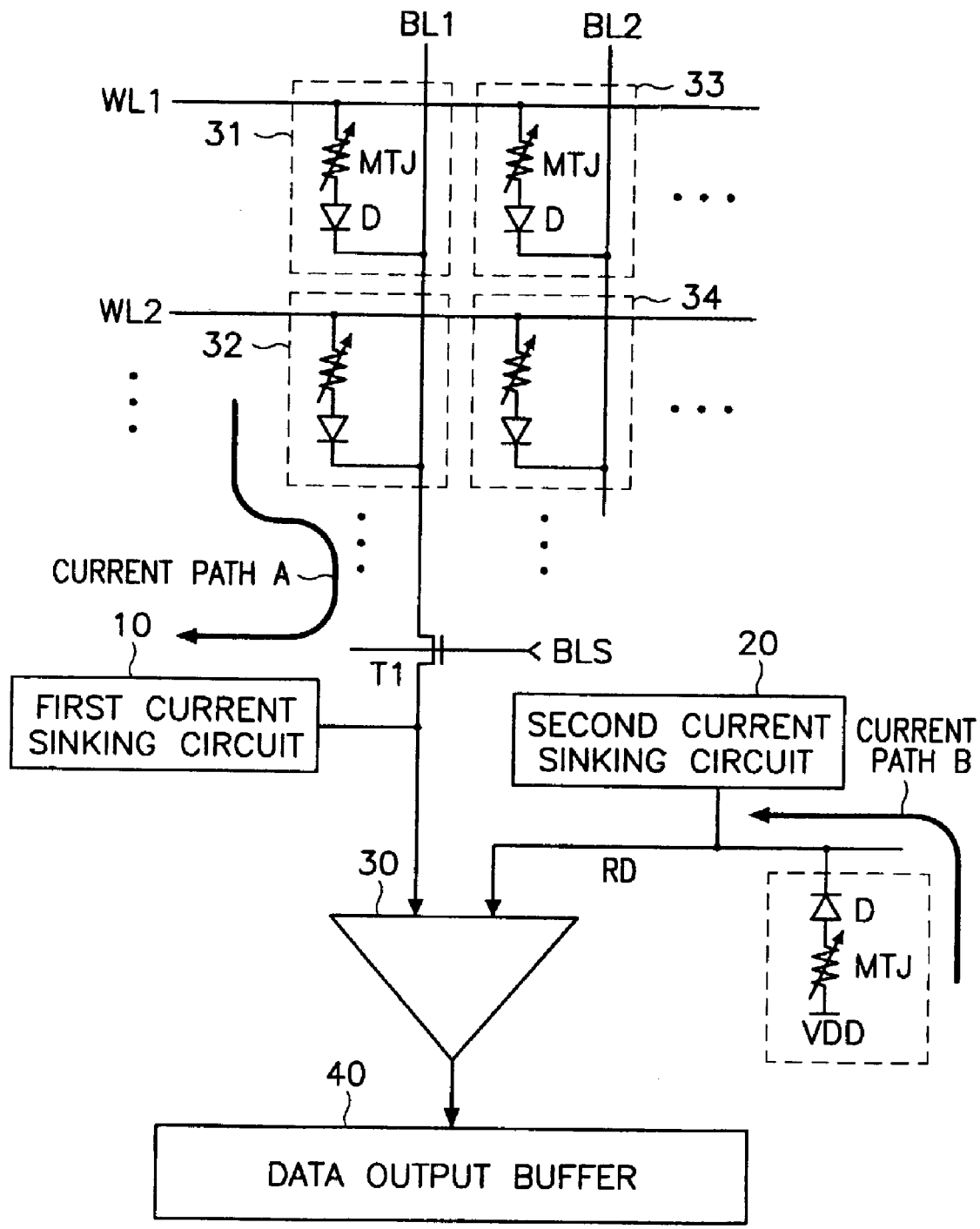
FIG. 4 is a view illustrating a third embodiment of an MRAM cell array.

FIG. 4 is a view illustrating a third embodiment of an MRAM cell array. The MRAM cell array of FIG. 4 has the same structure as the MRAM cell array of FIG. 2 except for MRAM cells 31–34 and a reference MRAM cell 35. That is, in each of the MRAM cells 31–34, an MTJ element has one terminal connected to a word line WL and the other terminal connected to an input terminal of a diode D, and an output terminal of the diode D is connected to a bit line BL. In the reference MRAM cell 35, an MTJ element has one terminal connected to a power supply voltage VDD and the other terminal connected to an input terminal of a diode D, and an output terminal of the diode D is connected to a reference node RD.

The MRAM cell array of FIG. 4 is operated in the same manner as the MRAM cell array of FIG. 2, and thus detailed explanations thereof will be omitted.

Figure 5:
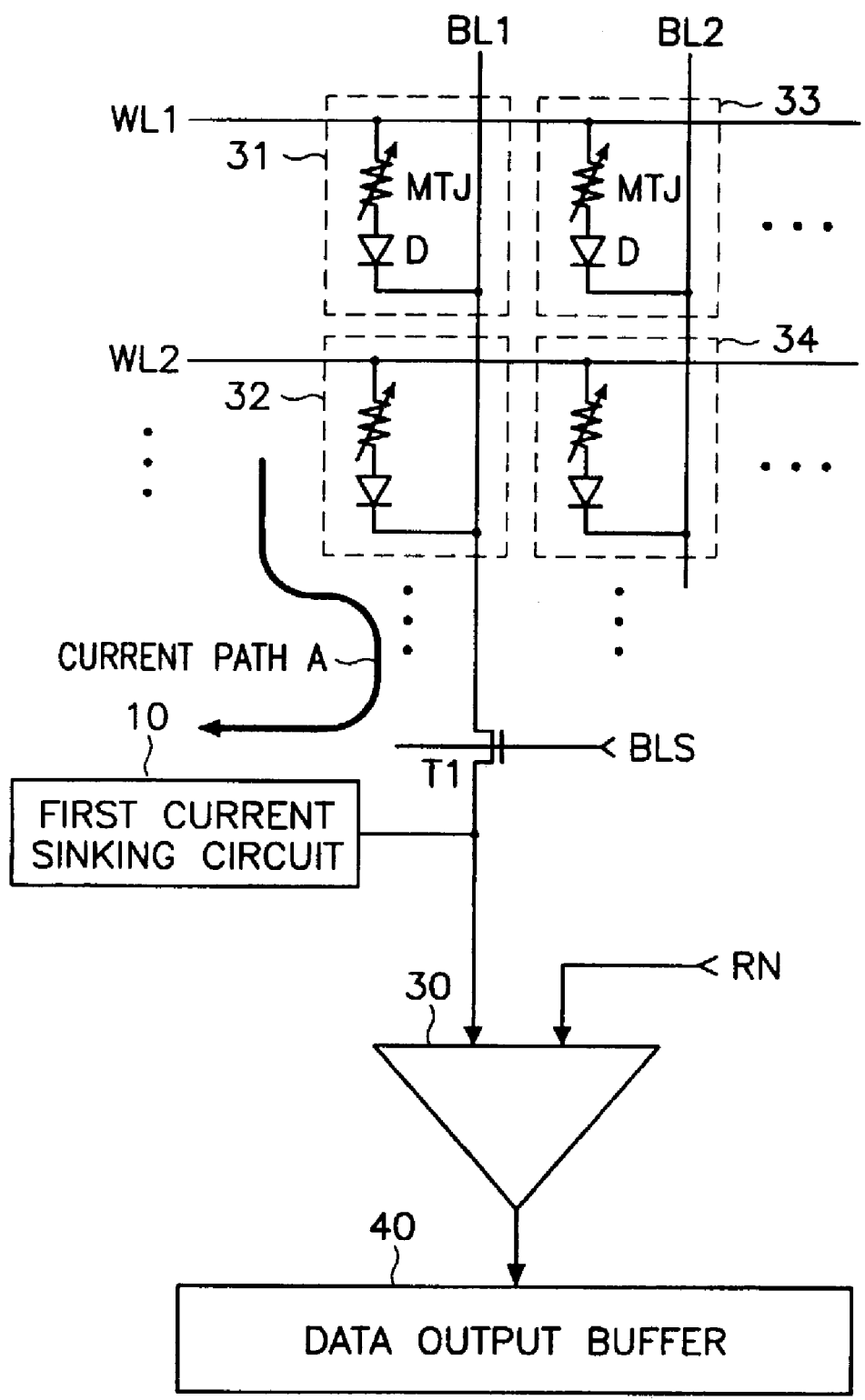
FIG. 5 is a view illustrating a fourth embodiment of an MRAM cell array.

The third embodiment of FIG. 4 can be modified into a fourth embodiment of FIG. 5. The MRAM cell array of the fourth embodiment does not include a reference MRAM cell and a second current sinking circuit, but supplies a reference voltage of a predetermined level for a reference node RN to a sense amplifier 30.

FIG. 6 is a circuit view illustrating the current sinking circuit of FIGS. 2 to 5. Each of the current sinking circuits 10 and 20 includes a pull-down transistor N2 to form the current path A (or B), a PMOS transistor P1 enabled in response to the inverted sense amplifier enable signal $\overline{SE}$, an inverter IV1 to invert a signal of a node A and output the inverted signal into a node B, and an NMOS transistor N3 to respond to a signal of the node B.

The operation of the current sinking circuits 10 and 20 will now be explained in more detail. In a data read operation of an MRAM cell selected by a bit line BL and a word line WL, when a positive voltage is transmitted to the cell plate CP, the current flowing to the sense amplifier node SAN (or RN) is transmitted to a ground voltage VSS terminal of the pull-down transistor N2, thereby forming the current path A (or B). Therefore, a voltage at the node A has a low level (0V) and the inverter IV1 outputs a high level to the node B. That is, when the PMOS transistor P1 is turned on according to the inverted sense amplifier enable signal $\overline{SE}$ to apply the power supply voltage VDD to the inverter IV1, the inverter IV1 is driven. As a result, the voltage of the node B has a high level. Accordingly, the NMOS transistor N3 is turned on, and thus a signal (=data) stored in the MRAM cell is transmitted to the sense amplifier node SAN (or RN). In other words, the first current sinking circuit 10 senses the signal of the MRAM cell and transmits it to the sense amplifier node SAN, and the second current sinking circuit 20 senses the reference signal of the reference MRAM cell and transmits it to the reference node RN.

FIG. 7 is a circuit view illustrating the sense amplifier 30 of FIGS. 2 to 5. The sense amplifier 30 is a current mirror type amplifier. An NMOS transistor N4 has its gate connected to receive the signal of the sense amplifier node SAN, and an NMOS transistor N5 has its gate connected to receive the signal of the reference node RN. An NMOS transistor N6 has its source and drain connected respectively to the ground voltage VSS and a node E, and its gate connected to receive the sense amplifier enable signal SE. A PMOS transistor P3 and an NMOS transistor P4 are connected in a current mirror form.

The sense amplifier 30 is enabled in response to the sense amplifier enable signal SE, to compare the voltage from the sense amplifier node SAN with the reference voltage from the reference node RN, discriminating the high/low level data, and outputting it.

As described above, the data stored in the MRAM cell are amplified and then supplied to the sense amplifier 30 by the current sinking circuits 10 and 20 connected to the bit lines BL during the data read operation of the MRAM cell, thereby stably reading the data.

Figure 8:
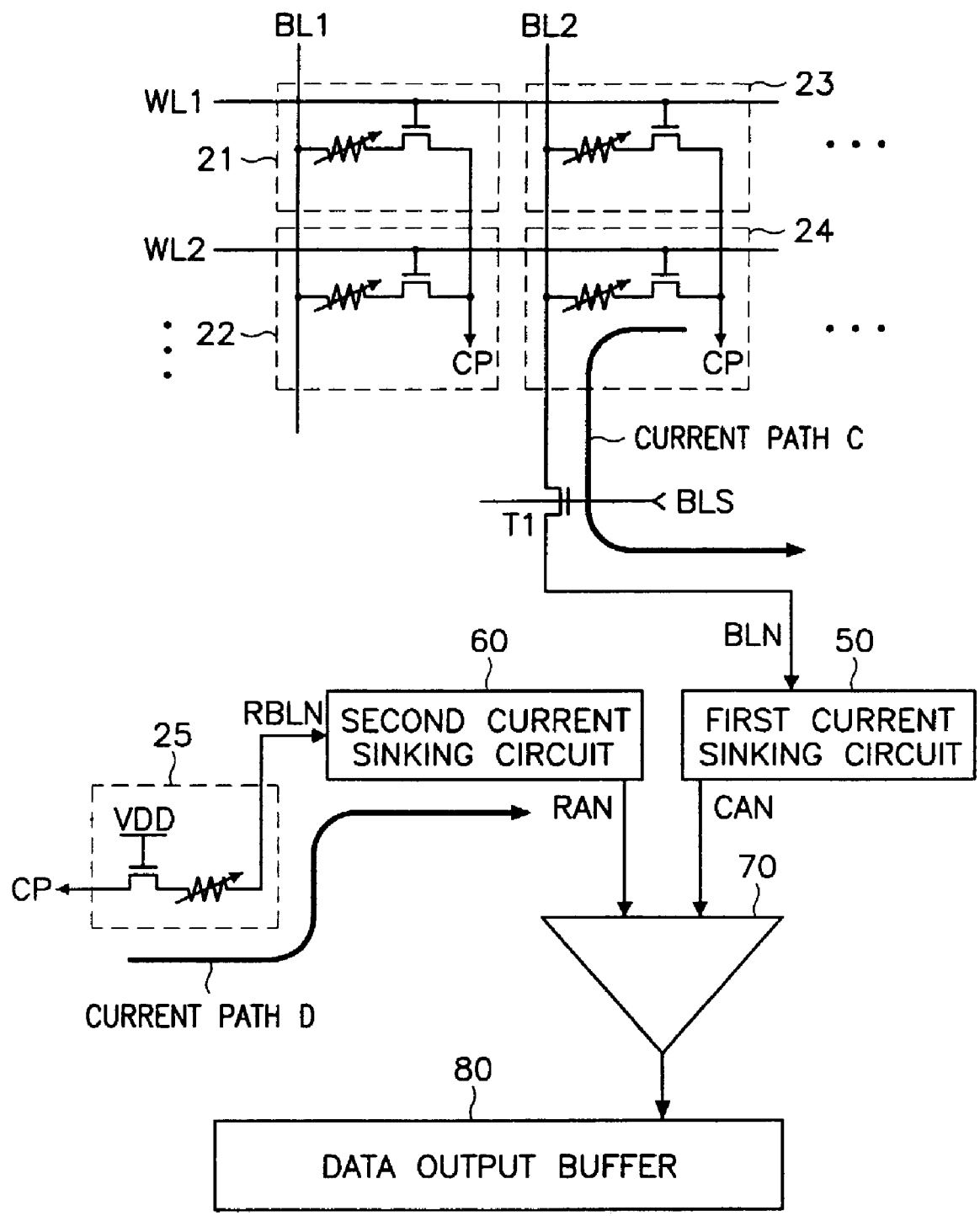
FIG. 8 is a view illustrating a fifth embodiment of an MRAM cell array.

FIG. 8 is a view illustrating a fifth embodiment of an MRAM cell. Here, MRAM cells 25 and a reference MRAM cell 25 of FIG. 8 are identical to those of FIG. 2, and are thus provided with like reference numerals. Identically to the MRAM cell array of FIG. 2, the MRAM cell array of FIG. 8 supplies a positive voltage to a cell plate CP of one MRAM cell selected by a word line WL and a bit line BL during the data read operation of the MRAM cell, thereby forming a current path C from an MTJ element of the MRAM cell to a first current sinking circuit 50.

The first current sinking circuit 50 converts a current flowing to a bit line node BLN through the current path E into a voltage, and outputs the resulting voltage to a cell sense amplifier node CAN. The operation of the first current sinking circuit 50 will later be explained in detail with reference to FIG. 12. In the reference MRAM cell 25, a voltage is supplied to a cell plate CP during the data read operation of the MRAM cell, thereby forming a current path D from an MTJ element of the reference MRAM cell 25 to a second current sinking circuit 60.

The second current sinking circuit 60 converts a current flowing to a reference bit line node RBLN through the current path D into a reference voltage, and outputs the resulting reference voltage to a reference sense amplifier node RAN. A sense amplifier 70 amplifies and compares the reference voltage of the reference sense amplifier node RAN with the voltage of the cell sense amplifier node CAN, discriminates a high/low level data, and outputs it to a data output buffer 80.

Figure 9:
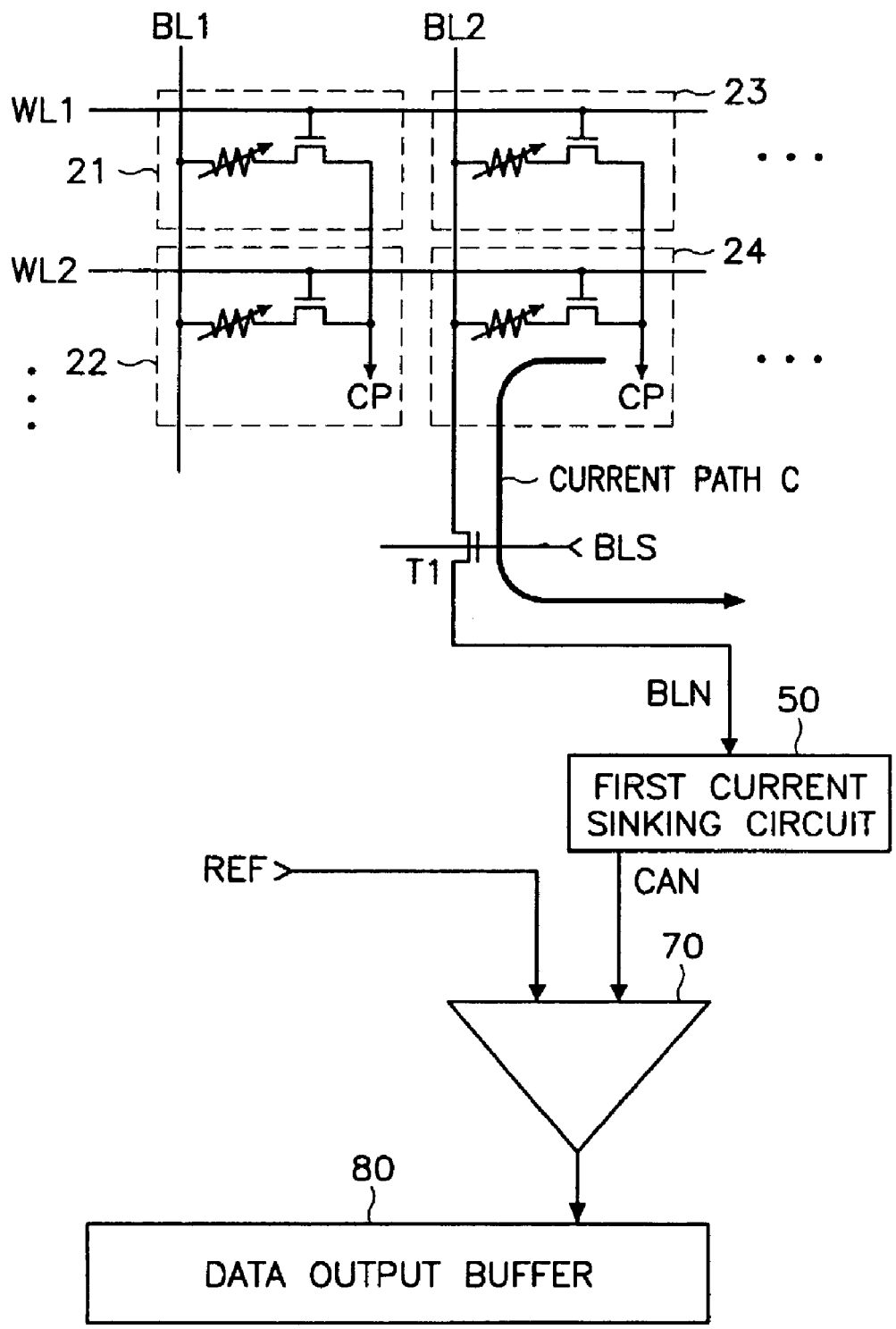
FIG. 9 is a view illustrating a sixth embodiment of an MRAM cell array.

The fifth embodiment of FIG. 8 can be modified into a sixth embodiment of FIG. 9. The MRAM cell array of the sixth embodiment does not include a reference MRAM cell and a second current sinking circuit, but supplies a reference voltage of a predetermined level to a reference node RN of a sense amplifier 30.

Figure 10:
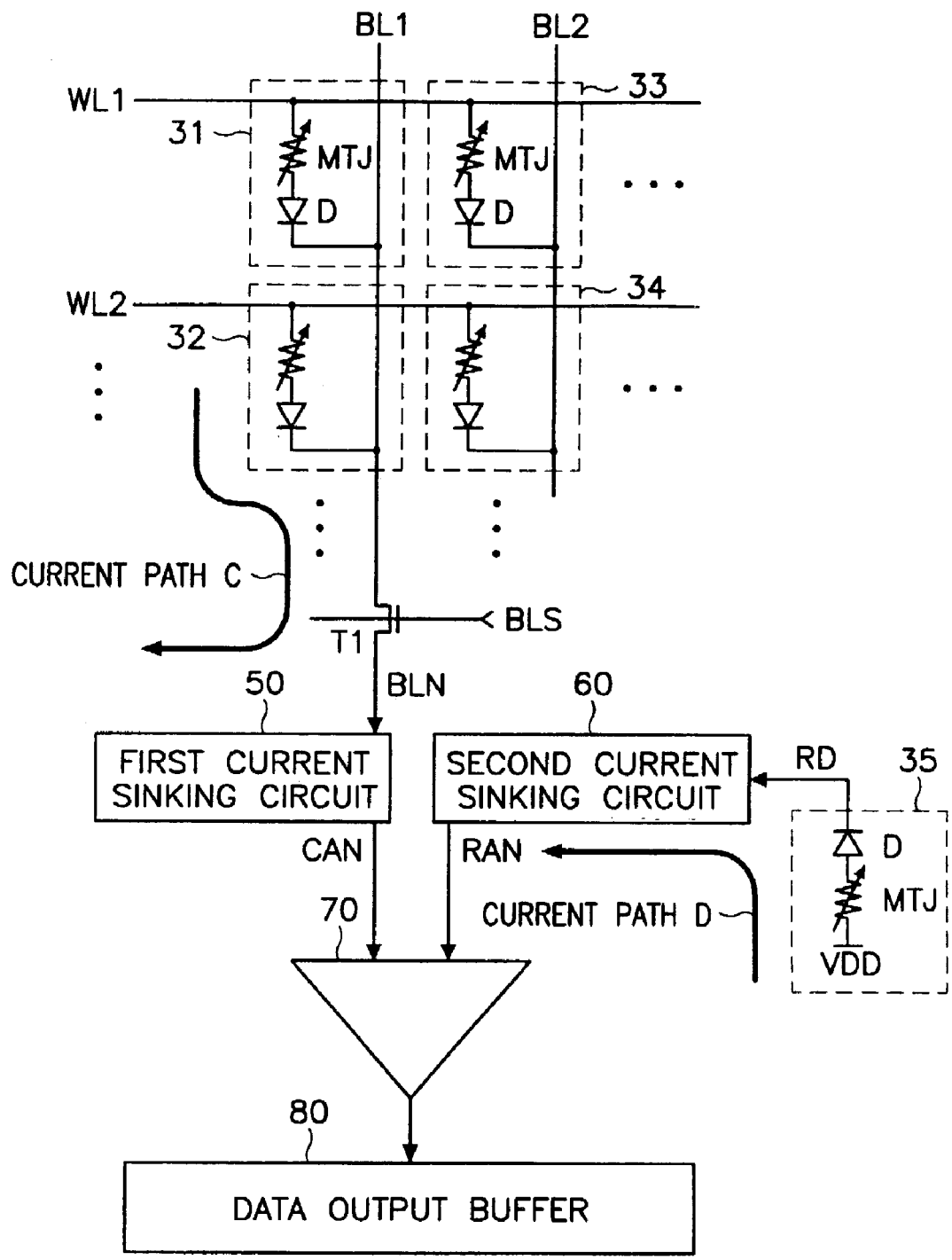
FIG. 10 is a view illustrating a seventh embodiment of an MRAM cell array.

FIG. 10 is a view illustrating a seventh embodiment of an MRAM cell array and a sense amplifier. The MRAM cell array of FIG. 10 has the same structure as the MRAM cell array of FIG. 8 except for MRAM cells 31–34 and an MRAM cell 35. That is, in each of the MRAM cells 31–34, an MTJ element has one terminal connected to a word line WL and the other terminal connected to an input terminal of a diode D, and an output terminal of the diode D is connected to a bit line BL. In the MRAM cell 35, an MTJ element has one terminal connected to a power supply voltage VDD and the other terminal connected to an input terminal of a diode D, and an output terminal of the diode D is connected to a reference node RD. Accordingly, the MRAM cell array of FIG. 10 is operated in the same manner as the MRAM cell array of FIG. 8, and thus detailed explanations thereof will be omitted.

Figure 11:
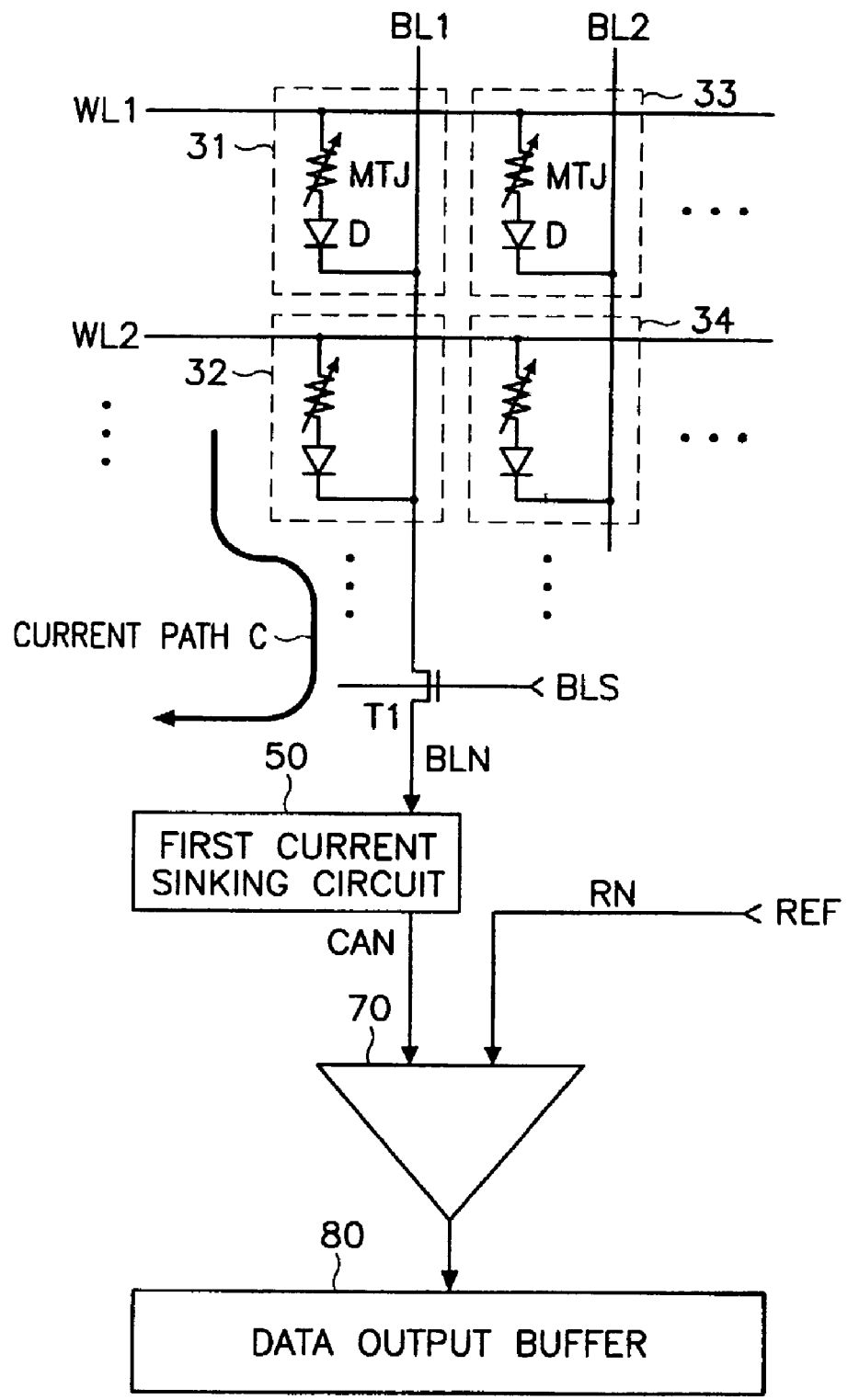
FIG. 11 is a view illustrating an eighth embodiment of an MRAM cell array.

The seventh embodiment of FIG. 10 can be modified into an eighth embodiment of FIG. 11. The MRAM cell array of the eighth embodiment does not include a reference MRAM cell and a second current sinking circuit, but supplies a reference voltage REF of a predetermined level for a reference node RN of a sense amplifier 70.

Figure 12:
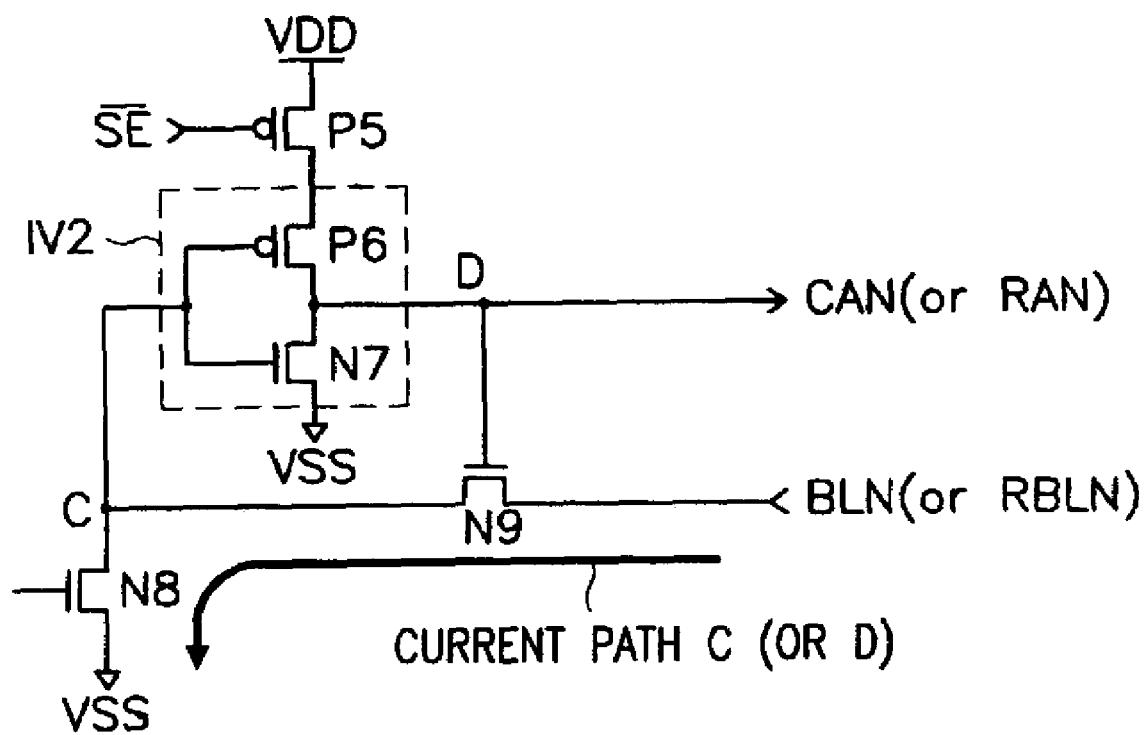
FIG. 12 is a circuit view illustrating a current sinking circuit of FIGS. 6 to 11.

FIG. 12 is a circuit view illustrating the current sinking circuit of FIGS. 6 to 11. Each of the current sinking circuits 50 and 60 includes a pull-down transistor N8 to form the current path C (or D), a PMOS transistor P5 enabled in response to the inverted sense amplifier enable signal $\overline{SE}$, an inverter IV2 to amplify and invert a signal of a node C and then output the inverted signal to a node D, and an NMOS transistor N9 to respond to a signal of the node D.

The operation of the current sinking circuits 50 and 60 will now be explained in more detail. In a data read operation of an MRAM cell selected by a bit line BL and a word line WL, when a positive voltage is supplied to the cell plate CP, the current flowing to the bit line node BLN (or RBLN) is transmitted to a ground voltage VSS terminal of the pull-down transistor N8, thereby forming the current path C. Therefore, a voltage at the node C has a low level (0V) and a voltage at the node D has a high level by the inverter IV2. That is, when the PMOS transistor P5 is turned on in response to the inverted sense amplifier enable signal $\overline{SE}$ to transmit the power supply voltage VDD to the inverter IV2, the inverter IV2 is driven to enable the voltage of the node D in a high level. Accordingly, the high level voltage is transmitted to the cell sense amplifier node CAN (or RAN).

That is, the first current sinking circuit 50 converts the current flowing to the bit line node BLN into a voltage and transmits the converted voltage to the cell sense amplifier node CAN, and the second current sinking circuit 60 converts the current flowing to the reference bit line node RBLN into a reference voltage and transmits the reference voltage to the reference sense amplifier node RAN. Thereafter, the sense amplifier 70 amplifies and compares the voltage of the cell sense amplifier node CAN with the reference voltage of the reference sense amplifier node RAN, and discriminates the high/low level data.

As discussed earlier, the MRAM forms the current path by connecting the current sinking circuit to the bit line, converts the current flowing through the current path into the voltage, and amplifies the voltage, thereby stably reading the high/low level data. As a result, reliability of the semiconductor memory device is improved. Moreover, the MRAM connects the current sinking circuit to the bit line during the data read operation of the MRAM cell, thereby increasing sensing sensitivity of the data.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A magneto-resistive random access memory (MRAM), comprising:

a first current sinking circuit to convert a current flowing from an MRAM cell to a sense amplifier node into a voltage and to control an amount of said current at a predetermined level during a data read operation;

a second current sinking circuit to convert a current flowing from a reference MRAM cell to a reference node into a reference voltage and to control an amount of said current at a predetermined level; and a sense amplifier to compare the voltage from the first current sinking circuit with the reference voltage from the second current sinking circuit, and amplify the comparison result;

wherein the first current sinking circuit comprises a first pull-down element to convert the current from the MRAM cell into a first voltage, a first inverting element to invert and amplify the first voltage from the first pull-down element and a switching means to output a stable signal in response to the output signal from the first inverting element; and wherein the second current sinking circuit comprises a second pull-down element to convert the current from the reference MRAM cell into a second voltage, a second inverting element to invert and amplify the second voltage from the second pull-down element and a second switching means to output a stable signal in response to the output signal from the second inverting element.

2. The MRAM according to claim 1, wherein the MRAM cell comprises:

a magneto-resistive tunneling junction (MTJ) element connected to a bit line; and a transistor having its gate connected to a word line and its source and drain connected respectively to the MTJ element and a cell plate.

3. The MRAM according to claim 1, wherein the MRAM cell comprises:

a magneto-resistive tunneling junction (MTJ) element connected to a word line; and a diode having an input terminal connected to the MTJ element and its output terminal connected to the bit line.

4. The MRAM according to claim 1, wherein the reference MRAM cell comprises:
   a magneto-resistive tunneling junction (MTJ) element connected to the reference node; and
   a transistor having its gate connected to receive a power supply voltage and its drain and source connected respectively to the MTJ element and a cell plate.

5. The MRAM according to claim 4, wherein a difference of magnetization directions between a variable magnetic layer and a pinned magnetic layer of the MTJ element of the reference MRAM cell is $\frac{1}{2}\pi$.

6. The MRAM according to claim 1, wherein the reference MRAM cell comprises:
   a magneto-resistive tunneling junction (MTJ) element to receive a power supply voltage; and
   a diode connected between the MTJ element and the reference node.

7. The MRAM according to claim 6, wherein a difference of magnetization directions between a variable magnetic layer and a pinned magnetic layer of the MTJ element of the reference MRAM cell is $\frac{1}{2}\pi$.

8. The MRAM according to claim 1, wherein the first current sinking circuit is configured to convert a current flowing to a bit line node through a current path into a voltage, and output the voltage to a cell sense amplifier node.

9. The MRAM according to claim 1, wherein the second current sinking circuit is configured to convert a current flowing from the reference MRAM cell to a reference bit line node into a reference voltage, and output the reference voltage to a reference sense amplifier node.

10. The MRAM according to claim 1, wherein the first current sinking circuit further comprises:
    a first enable means to selectively enable the first current sinking circuit in response to a sense amplifier enable signal.

11. The MRAM according to claim 1, wherein the second current sinking circuit further comprises:
    a second enable means to selectively enable the second current sinking circuit in response to a sense amplifier enable signal.

12. The MRAM according to claim 1, wherein the sense amplifier comprises a current mirror type amplifier enabled in response to a sense amplifier enable signal during a data read operation of the MRAM cell, to amplify and compare the voltage from the first current sinking circuit with the reference voltage from the second current sinking circuit, and output a high/low level data.

* * * * *